US006645820B1

(12) United States Patent
Peng et al.

(10) Patent No.: US 6,645,820 B1
(45) Date of Patent: Nov. 11, 2003

(54) POLYCRYSTALLINE SILICON DIODE STRING FOR ESD PROTECTION OF DIFFERENT POWER SUPPLY CONNECTIONS

(75) Inventors: Kuo Reay Peng, Tainan (TW); Jian-Hsing Lee, Hsin-Chu (TW); Shui-Hung Chen, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/119,337

(22) Filed: Apr. 9, 2002

(51) Int. Cl.$^7$ ............................................. H01L 21/331
(52) U.S. Cl. ..................... 438/372; 438/340; 438/338; 438/369; 438/548; 438/533; 438/546; 438/979; 438/983
(58) Field of Search ................. 438/338, 340, 438/343, 369, 372, 373, 510, 514, 519, 523, 527, 532, 533, 546, 548, 914, 979, 983; 257/355, 356, 360, 361

(56) References Cited

U.S. PATENT DOCUMENTS

| | | | |
|---|---|---|---|
| 4,616,404 A | 10/1986 | Wang et al. | 438/491 |
| 5,166,089 A * | 11/1992 | Chen et al. | 438/328 |
| 5,576,557 A * | 11/1996 | Ker et al. | 257/173 |
| 5,674,761 A | 10/1997 | Chang et al. | 438/237 |
| 5,850,095 A * | 12/1998 | Chen et al. | 257/361 |
| 5,856,214 A | 1/1999 | Yu | 438/133 |
| 6,015,993 A | 1/2000 | Voldman et al. | 257/355 |
| 6,051,462 A * | 4/2000 | Ohno | 438/241 |
| 6,096,584 A | 8/2000 | Ellis-Monaghan et al. | 438/151 |
| 6,118,155 A | 9/2000 | Voldman | 257/360 |
| 6,229,157 B1 | 5/2001 | Sandhu | 257/75 |
| 6,232,163 B1 | 5/2001 | Voldman et al. | 438/212 |
| 6,458,632 B1 * | 10/2002 | Song et al. | 438/133 |

OTHER PUBLICATIONS

The paper "On–Chip ESD Protection Design by Using Polysilicon Diodes in CMOS Technology for Smart Card Application," by Wang et al., EOS/ESD Symposium 00–266 , pp. 3A.4.1–3A.4.10.

"On–Chip ESD Protection Design by Using Polysilicon Diodes in CMOS Process," Ker et al., IEEE Journal of Solid–State Circuits, IEEE, New York, vol. 36, No. 4, Apr. 2001, pp. 678–686.

"On–Chip ESD Protection Design for GHz RF Integrated Circuits by Using Polycrystalline Silicon Diodes in Sub–quarter–micron CMOS Process," Chang and Ker, Proceedings 2000 Electrical Overstress and Electrostatic Discharge Symp., IEEE, New York, NY, 2000, pp. 3A4.1–3A.4.10.

"Design of the Turn–On Efficient Power–Rail ESD Clamp Circuit with Stacked Polysilicon Diodes," Ker and Chen, Proceeding of the 2001 Int'l Symp. on Circuits and Systems, IEEE, New York, 2001, pp. IV–758–IV–761.

* cited by examiner

*Primary Examiner*—Amir Zarabian
*Assistant Examiner*—Maria Guerrero
(74) *Attorney, Agent, or Firm*—George O. Saile; Stephen B. Ackerman

(57) ABSTRACT

An ESD protection circuit protects integrated circuits having multiple power supply voltage sources from damage when an ESD event causes excessive differential voltages between the multiple separate power supply voltage sources. The ESD protection circuit has a string of serially connected lateral polycrystalline silicon diodes characterized by consistent turn-on threshold voltage level such that as the number of stage of the ESD protection circuit increase, the turn-on voltage threshold of the ESD protection circuit increase linearly.

9 Claims, 15 Drawing Sheets

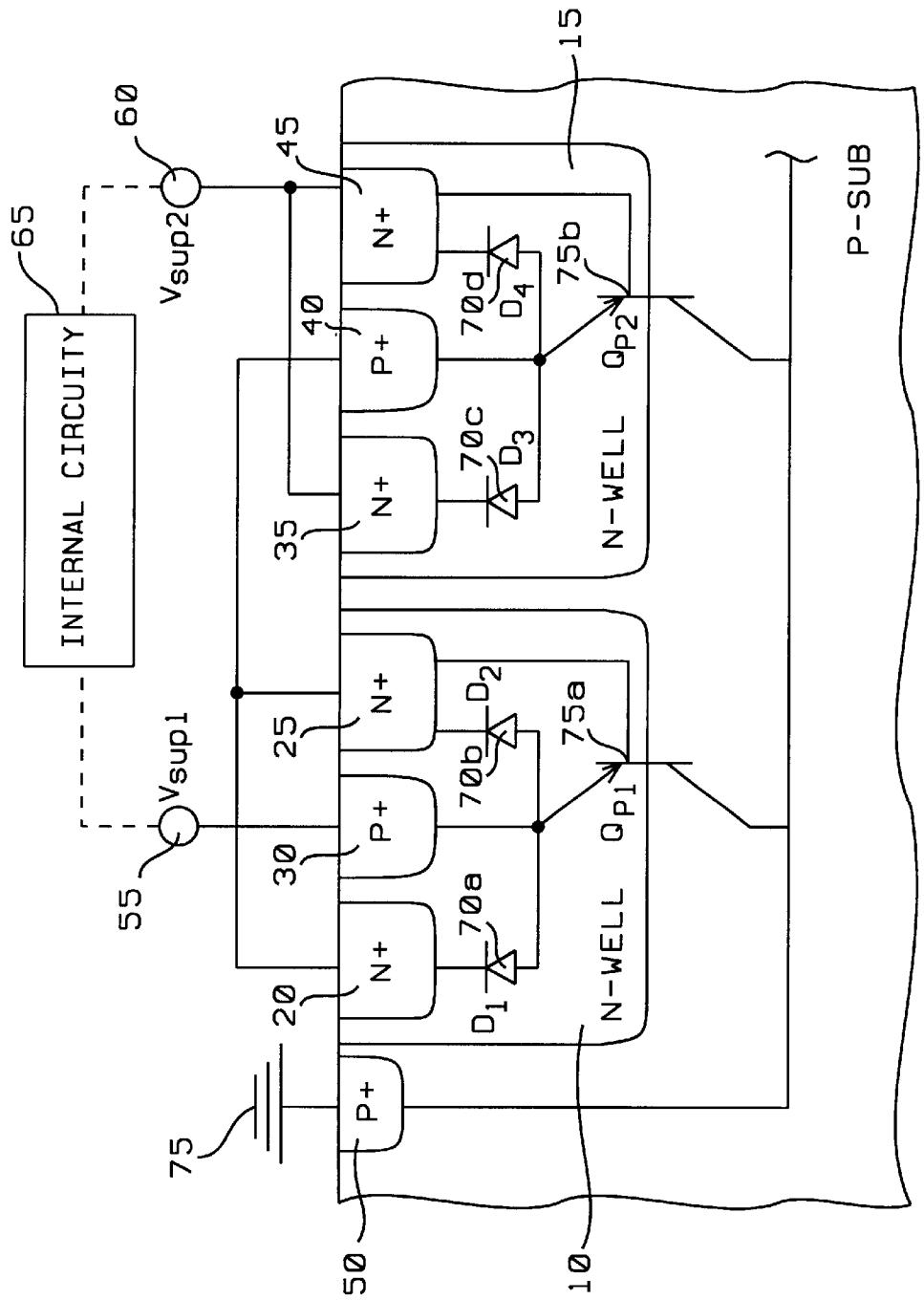
FIG. 1 – Prior Art

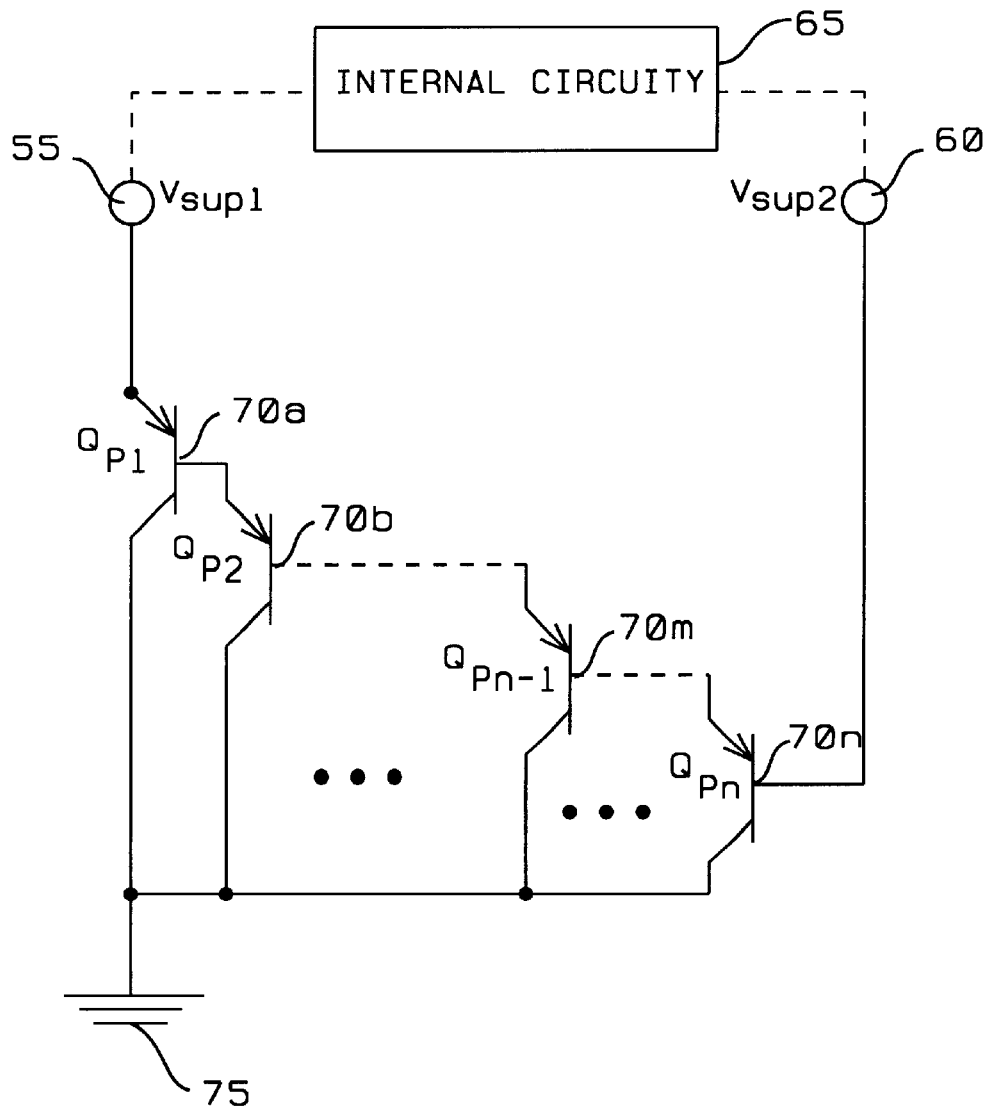
FIG. 2 – Prior Art

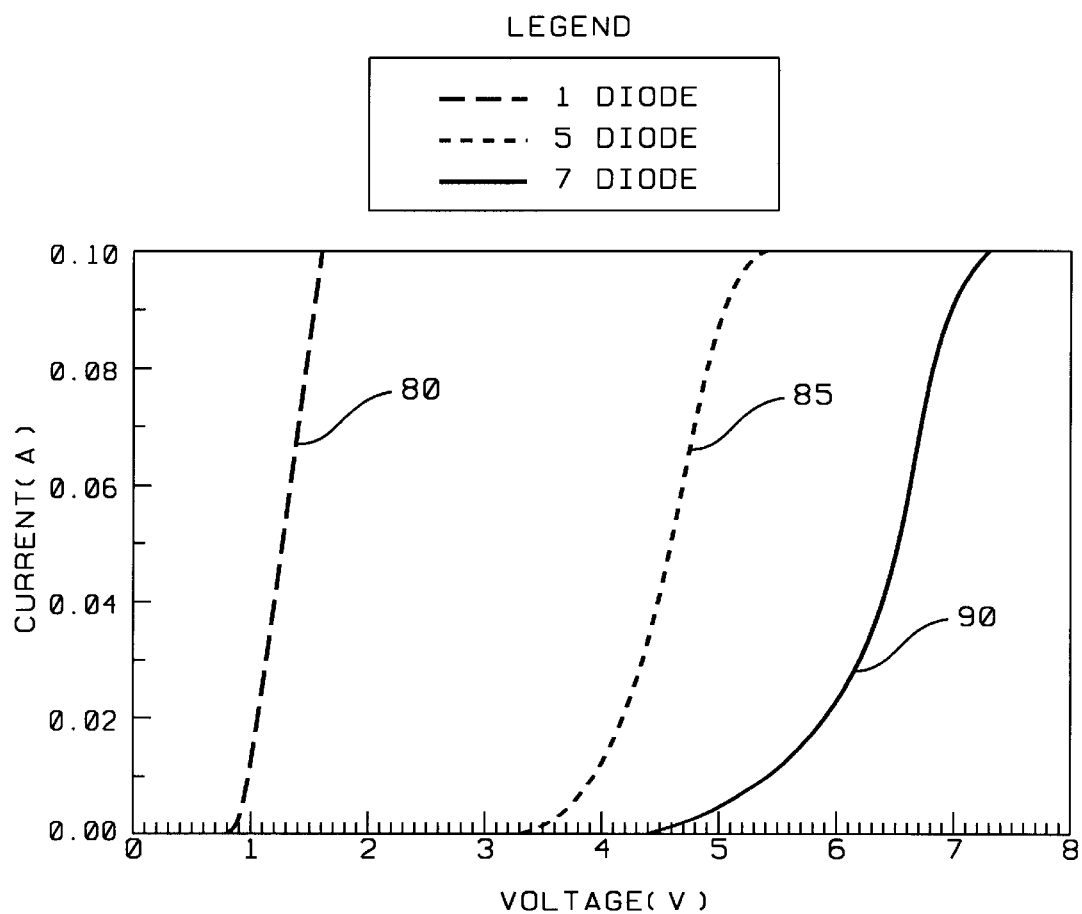
FIG. 3 – Prior Art

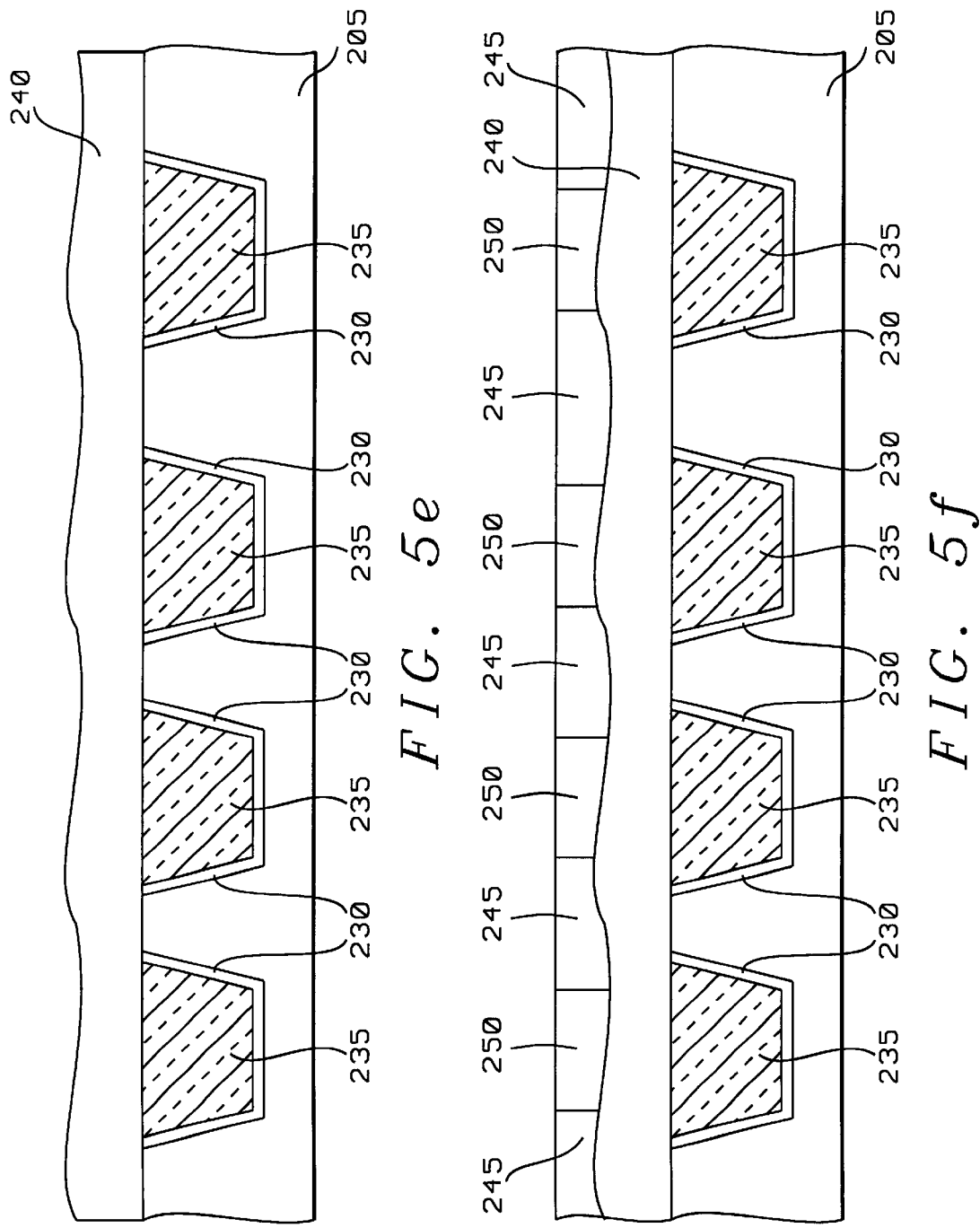

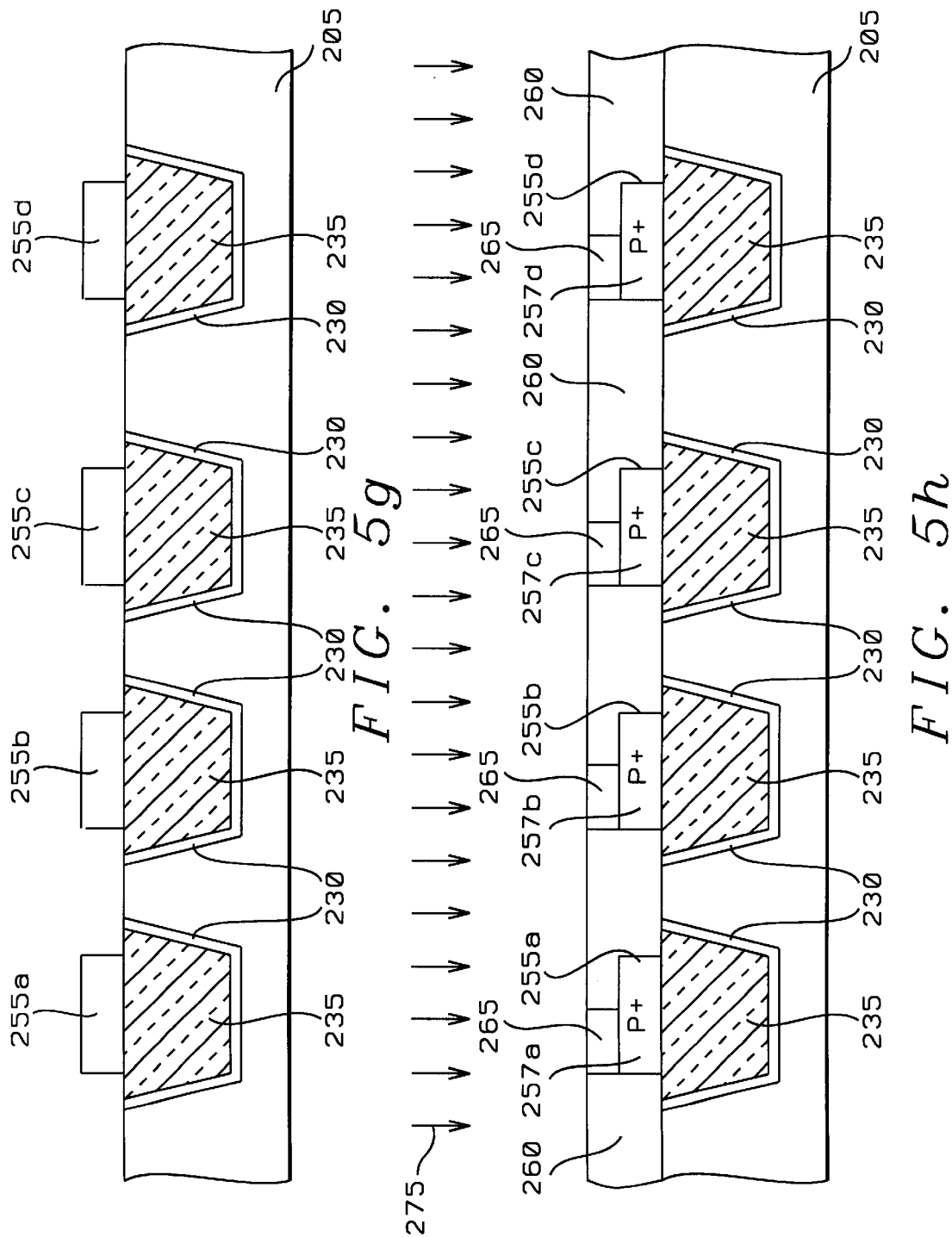

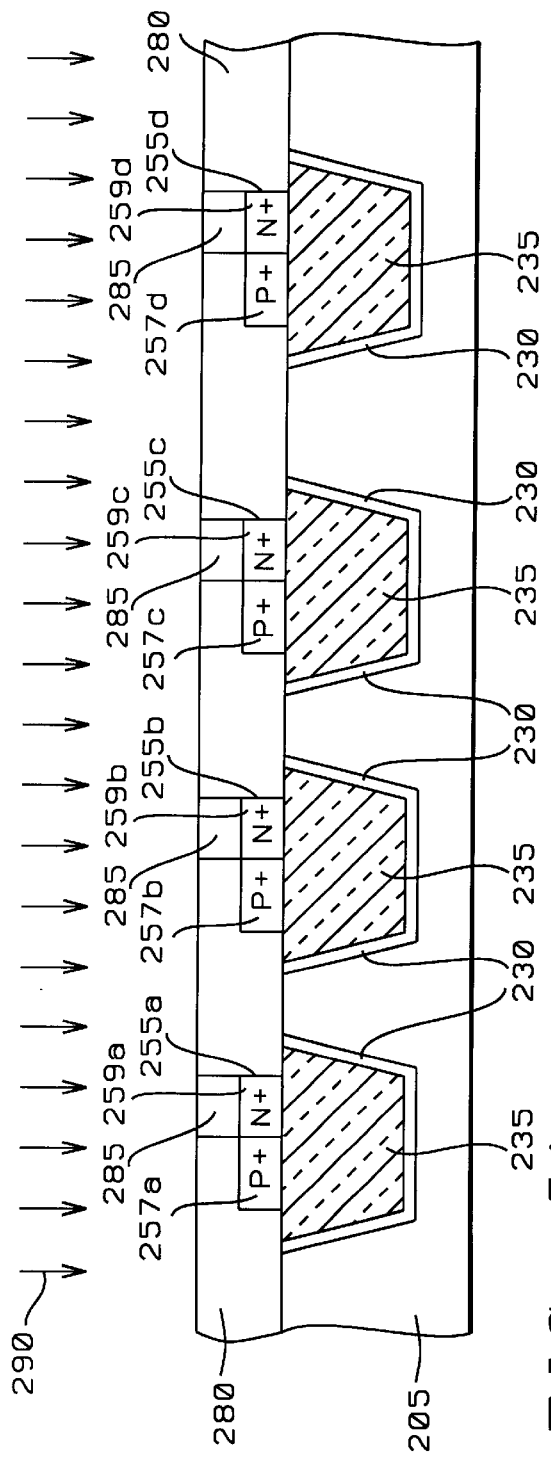
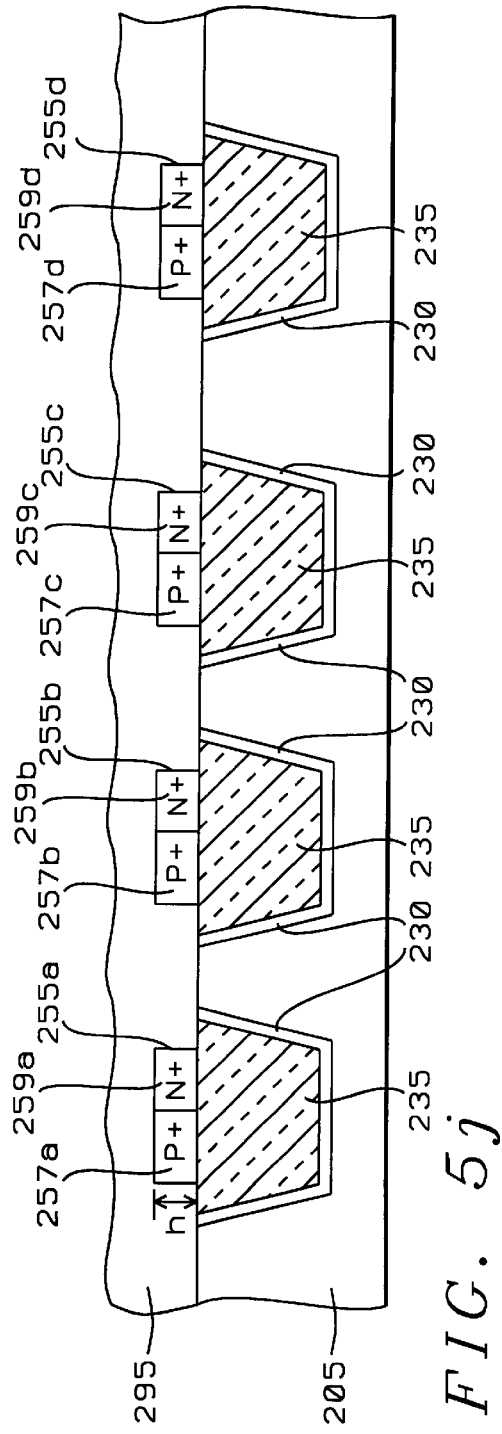
FIG. 5i
FIG. 5j

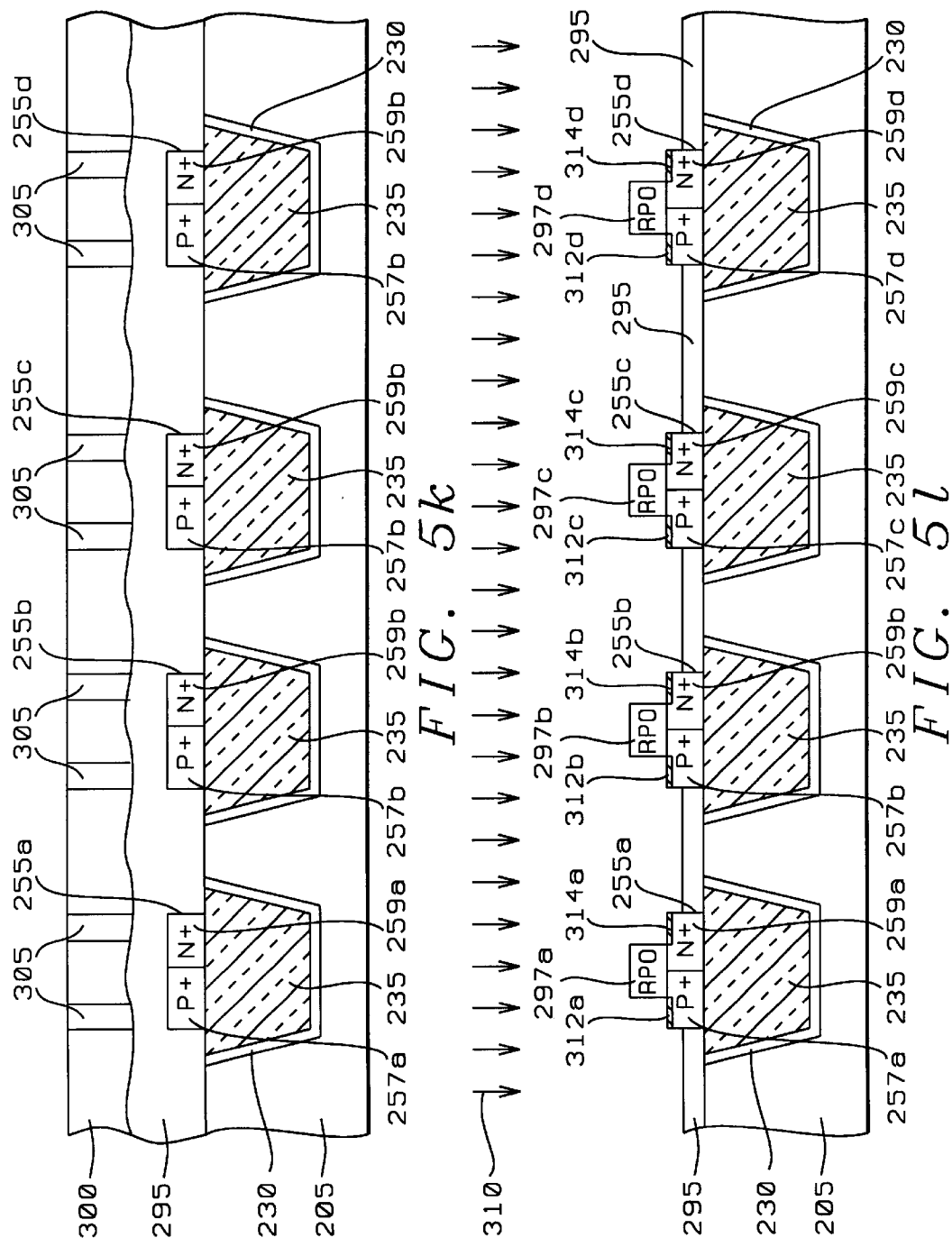

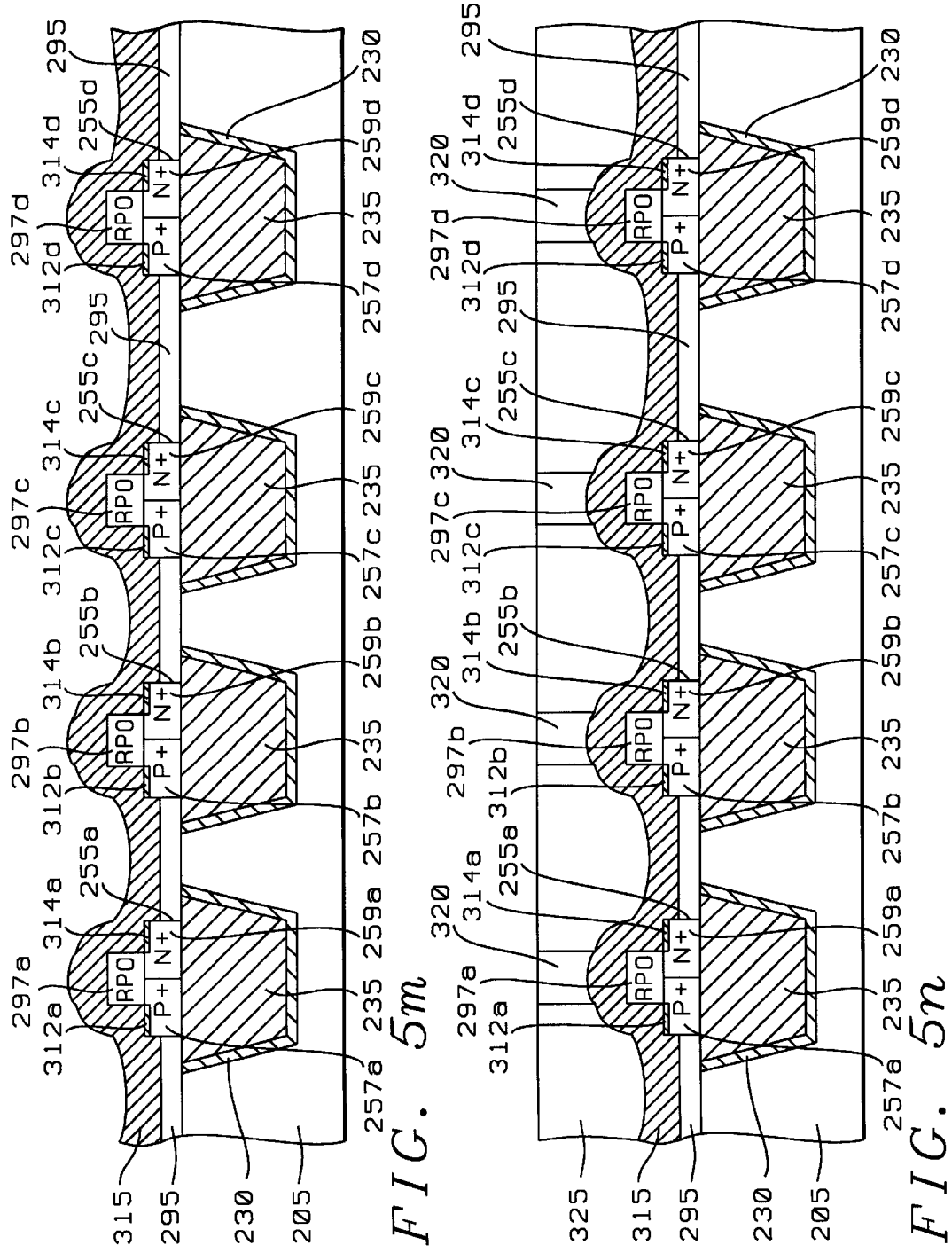

POLYCRYSTALLINE SILICON DIODE STRING FOR ESD PROTECTION OF DIFFERENT POWER SUPPLY CONNECTIONS

BACKGROUND OF THE INVENTION

1. Field of the Invention

This invention relates to circuits coupled to an integrated circuit that provides protection from electrostatic discharge (ESD) events. More particularly, this invention relates to circuits that will prevent a differential voltage level between two different power supply voltage terminals from exceeding a specified voltage level and thus prevent damage to the integrated circuit.

2. Description of Related Art

Integrated circuits often have either multiple terminals connected to a single power supply voltage source or multiple isolated power supply voltage sources. The power supply voltage sources are connected through separate distribution networks to the internal integrated circuits. The structure of the internal integrated circuits may have a core logic section and a peripheral logic section. In order to isolate noise, such as caused by simultaneous switching of driver circuits in the peripheral logic section or impedance mismatch on transmission line connected to an input/output (I/O) pad, the peripheral logic section would have a separate power supply distribution network from that of the core logic section. Similarly, the internal circuits may include analog circuits requiring multiple power supply voltage sources and need to be isolated from the core logic and peripheral logic section to prevent conduction of noise to the analog circuits.

While the core logic section and the peripheral logic section often have a common power supply voltage source, it is not uncommon for the core logic section to have a power supply voltage source of a different voltage level than the peripheral logic section. For instance, the peripheral logic section may have a power supply voltage source of 5.0V and the core logic section may have a power supply voltage source of 3.3V. It is further common that the analog section require even different voltage levels than the core logic section or the peripheral logic section. Further, the internal integrated circuits may have implementations with multiple core logic sections, multiple peripheral logic sections, and multiple analog core sections. Each section will have a separate voltage distribution network for the power source and return paths.

An ESD event is commonly a pulse of a very high voltage typically of several kilovolts with a moderate current of a few amperes for a short period, typically about 100 nanoseconds. The common source of an ESD event is bringing the integrated circuit in contact with a human body or a machine such as an integrated circuit tester and handler.

If an I/O pad is contacted and subjected to an ESD event, the power supply distribution network of the peripheral logic section connected to the I/O pad begins to change relative to the voltage level of the power supply voltage source connected to the core logic section. This change can cause damage in subcircuits that form an interface between the core logic section and the peripheral logic section. FIG. 1 illustrates a structure of the prior art of a voltage clamping circuit employed to prevent damage between the distribution networks of two separate power supply voltage sources. The structure of FIG. 1 illustrates a two-staged voltage clamping circuit, which may be expanded by the addition of more stages.

A substrate has the distribution networks 55 and 60 to connect the separate power supplies $V_{sup1}$ and $V_{sup2}$ to the internal circuitry 65. To provide the protection from any ESD events, the voltage clamping circuit is connected between the distribution networks 55 and 60 to connect the separate power supplies $V_{sup1}$ and $V_{sup2}$. The voltage clamping circuit has an N-type impurity diffused to a lightly doped level into the P-type substrate to form the N-wells 10 and 15. The N-type impurity is diffused to a high concentration level into the N-wells 10 and 15 to form the heavily doped N-regions 20, 25, 35, and 45. A P-type material is diffused to a high concentration into the N-wells 10 and 15 to form the heavily doped P-regions 30 and 40. Simultaneously the P-type material is diffused into the substrate 5 to form the P-region 50. Contact metallurgy is alloyed to the P-type region 50 to form a contact that is connected to the ground reference distribution system 75.

Contact metallurgy is alloyed to the P-type regions 30 and 40 to form contacts that are respectively connected to the distribution networks 55 and 60 for the power supply voltage sources $V_{sup1}$ and $V_{sup2}$. Contact metallurgy is alloyed to the N-type regions 20 and 25 and to the P-type region 40 to form a contact that serially interconnects the two stages of the voltage clamping circuit. Contact metallurgy is alloyed to the N-type regions 35 and 45 to form contacts that are connected to the distribution network 60 that is connected to the power supply voltage source $V_{sup2}$.

The diode $D_1$ 70a is formed at the junction of the P-region 30 and N-well 10 in conjunction with the N-region 20. Similarly, the diodes $D_2$ 70b, $D_3$ 70c, and $D_4$ 70d are formed at the junction of the P-regions 30 and 40 and N-wells 10 and 15 in conjunction respectively with the N-regions 25, 35, and 45. Further the emitter of the vertical PNP transistor 75a is formed by the P-region 30, the base being the N-well 10, and the collector being the P-type substrate 5. Likewise, the emitter of the vertical PNP transistor 75b is formed by the P-region 40, the base being the N-well 15, and the collector being the P-type substrate 5.

Referring now to FIG. 2 for a discussion of the operation of the voltage clamping circuit of the prior art. In this example, the voltage clamping circuit has multiple PNP transistors 75a, 75b, . . . , 75m, . . . , 75n serially connected emitter to base. The emitter of first PNP transistor 75a is connected to the distribution network 55 of the power supply voltage source $V_{sup1}$. The base of the last PNP transistor 75n is connected to the distribution network 60 of the power supply voltage source $V_{sup2}$. The collectors of the PNP transistors 75a, 75b, . . . , 75m, . . . , 75n are connected to the ground reference distribution system 75. If the voltage level present on the distribution network of the power supply voltage supply $V_{sup1}$ increases to a threshold level greater than the voltage level of the power supply voltage source $V_{sup2}$, the base-emitter diodes of the PNP transistors 75a, 75b, . . . 75m, . . . , 75n begin to conduct to clamp any voltage difference between the power supply voltage source $V_{sup1}$ and the power supply voltage source $V_{sup2}$ to maintain the threshold level difference between the power supply voltage sources $V_{sup1}$ and $V_{sup2}$.

The threshold level is determined by the number of serially connected PNP transistors 75a, 75b, . . . , 75m, . . . , 75n and is calculated from the formula:

$$V_t = mV_d - V_d m * m(m-1)^{*ln(\beta+1)/2}$$

where:

$V_t$ is threshold level of the voltage clamping circuit.

m is the number of PNP transistors 75a, 75b, . . . , 75m, . . . , 75n.

$V_d$ voltage developed across each individual base emitter junction of the PNP transistors 75a, 75b, 75m, ..., 75n. $V_o$ is determined by the formula:

$$V_o = \frac{KT}{q}$$

where:
K is Boltzman's constant.
T is the temperature.
q is electrical charge of an electron.

It is known that the main cause in a decrease in the breakdown or conduction voltage of during an ESD event is the leakage current from of the base-emitter junction of the PNP transistors 75a, 75b, ..., 75m, ..., 75n. Thus, as the number of PNP transistors 75a, 75b, ..., 75m, ..., 75n increases, the threshold level does not increase concomitantly.

Other ESD device structures as illustrated in U.S. Pat. No. 5,674,761 (Chang, et al.), U.S. Pat. No. 5,856,214 (Yu), and U.S. Pat. No. 6,096,584 (Ellis-Monaghan, et al.) provide ESD devices structures that prevent damage to internal circuitry by preventing excess voltage as applied to input/output pads from damaging internal circuitry.

Polycrystalline silicon diodes are well known in the art as illustrated by U.S. Pat. No. 4,616,404 (Wang, et al.). Wang, et al. describes a method of making improved lateral polycrystalline silicon diode by treating plasma-etched sidewalls to remove defects. The lateral polycrystalline diode is characterized by low reverse current leakage, a breakdown voltage of at least five volts, and low series resistance permitting high current flow before being limited by saturation. The polycrystalline silicon diode has a polycrystalline silicon block formed on a substrate. The polycrystalline silicon block has a first zone sufficiently doped to provide a first semiconductor type and a second zone sufficiently doped to provide a second semiconductor type. The junction where the two zones are adjoined form a diode.

Another polycrystalline diode is described in U.S. Pat. No. 6,229,157 (Sandhu). The polycrystalline silicon diode of Sandhu has a relatively improved on-off ratio. The diode is formed in a container in an insulative structure layered on a substrate of an integrated circuit. The container is then partially filled with a polycrystalline silicon material, by methods such as conformal deposition, leaving a generally vertical seam in the middle of the polycrystalline silicon material. An insulative material is deposited in the seam. The polycrystalline silicon material is appropriately doped and electrical contacts and conductors are added as required. The diode can be coupled to a chalcogenide resistive element to create a chalcogenide memory cell.

A polycrystalline diode structure that has a high voltage tolerance, which is to be used for mixed-voltage, and mixed signal and analog/digital applications is described in U.S. Pat. No. 6,232,163 and U.S. Pat. No. 6,015,993 (both to Voldman, et al.). The diode includes a polycrystalline silicon gate structure on at least one dielectric film layer on a semiconductor (silicon) layer or body. A well or an implanted area is formed in a bulk semiconductor substrate or in a surface silicon layer on an SOI wafer. A block mask is formed over the gate structure when defining the depleted-polycrystalline silicon gate silicon diode to form low series resistance diode implants, preventing over-doping the film.

An application of polycrystalline silicon diodes is shown in "On-Chip ESD Protection Design by Using Polysilicon Diodes in CMOS Process," Ker et al., IEEE Journal Of Solid-State Circuits, IEEE, New York, N.Y., VOL. 36, NO. 4, April 2001, pp. 676–686 and "On-Chip ESD Protection Design for GHz RF Integrated Circuits by Using Polycrystalline silicon Diodes in sub-quarter-micron CMOS Process," Chang and Ker, Proceedings 2000 Electrical Overstress and Electrostatic Discharge Symposium, IEEE, New York, N.Y., 2000, pp. 3A 4.1–3A 4.10. These papers describe applications using polycrystalline silicon diodes as the ESD clamp devices in CMOS process. Different process factors are experimentally evaluated to find the suitable doping concentration for optimizing the polycrystalline silicon diodes for both on-chip ESD protection design and the application requirements of the smart-card IC's.

Another application for polycrystalline silicon diodes for ESD applications is described in "Design of the Turn-On Efficient Power-Rail ESD Clamp Circuit with Stacked Polysilicon Diodes," Ker and Chen, Proceeding of the 2001 International Symposium on Circuits and Systems, IEEE, New York, 2001, pp. IV-758–IV-761. Ker and Chen detail a novel power-rail ESD clamp circuit design by using stacked polycrystalline silicon diodes to trigger ESD protection device is proposed to achieve excellent on-chip ESD protection. The power-rail ESD clamp circuit employing the polycrystalline silicon diodes as described in Ker and Chen achieves a human body model ESD level has been successfully improved from the original~200V to become 3 Kv.

SUMMARY OF THE INVENTION

An object of this invention is to provide an ESD protection circuit that will protect integrated circuits having multiple power supply voltage sources from damage when an ESD event causes excessive differential voltages between the multiple separate power supply voltage sources.

Another object of this invention is to provide an ESD protection circuit having a lateral diode constructed of polycrystalline silicon characterized by consistent turn-on threshold voltage level such that as the number of stage of the ESD protection circuit increase, the turn-on voltage threshold of the ESD protection circuit increase linearly.

To accomplish at least one of these objects as well as other objects, an electrostatic discharge circuit that includes a plurality of serially connected polycrystalline silicon diodes formed on a surface of a substrate is connected between a first power supply voltage source and a second power supply voltage source to protect internal integrated circuits from damage due to an electrostatic discharge. Each diode of the plurality of serially connected polycrystalline diodes has a first electrode and a second electrode. The plurality of serially connected polycrystalline diodes has a first diode, which has its first electrode connected to the first power supply voltage source, and a last diode, which has its second electrode connected to the second power supply voltage source.

The first electrode of each diode of the plurality of serially connected polycrystalline silicon diodes is a first region of polycrystalline silicon being heavily doped with an impurity of a first type. Further, the second electrode of each diode of the plurality of serially connected polycrystalline diodes is a second region of polycrystalline silicon being heavily doped with an impurity of a second type. The second region being adjoined to the first region to form an electrical junction. Each diode is formed on a shallow trench isolation formed within the substrate. During formation of each diode a resistor protection oxide formed as an overlay to protect a portion of the first and second regions at the junction.

Generally, the first electrode of each polycrystalline silicon diode is defined as cathode and the second electrode of each polycrystalline silicon diode is defined as an anode. To maintain this definition, the impurity of the first type is an N-type impurity having a density of from approximately $10^{15}$ atoms/cm$^{-3}$ to approximately $10^{21}$ atoms/cm$^{-3}$. The impurity of the second type is a P-type impurity having a density of from approximately $10^{15}$ atoms/cm$^{-3}$ to approximately $10^{21}$ atoms/cm$^{-3}$.

The width of each of the diodes and the thickness of the polycrystalline silicon diodes and the doping levels of the first and second electrodes of each diode determines the resistivity of the diode and thus the current capacity of the diodes. The preferred thickness of the polycrystalline silicon diodes is preferably from approximately 1000 Å to approximately 3000 Å. The width of polycrystalline silicon diodes is preferably from approximately 0.5 μm to approximately 100 μm.

The number of the plurality of serially connected polycrystalline silicon diodes of the electrostatic discharge circuit is determined by the formula:

$$n \geq \frac{V_{noise} + |Vx1 - Vx2|}{V_T}$$

where:
  n is the number serially connected of polycrystalline silicon diodes,
  $V_{noise}$ is the maximum voltage level difference allowed to be present on the internal integrated circuits between the first power supply voltage source and the second power supply voltage source,
  Vx1 is the magnitude of the first power supply voltage source,
  Vx2 is the magnitude of the second power supply voltage source, and
  $V_T$ is the threshold voltage of each polycrystalline silicon diodes.

BRIEF DESCRIPTION OF THE DRAWINGS

FIG. 1 is a cross sectional view of the structure of an ESD protection circuit of the prior art.

FIG. 2 is an schematic of an equivalent circuit of the ESD protection circuit of the prior art as described in FIG. 1

FIG. 3 is plot of the ESD protection circuit of the prior art illustrating the current through a number of stages of the ESD protection circuit versus the voltage across the ESD protection circuit of the prior art.

FIG. 4a is an schematic of an equivalent circuit of the ESD protection circuit of this invention as described in FIG. 4a.

DETAILED DESCRIPTION OF THE INVENTION

Figure 4A:
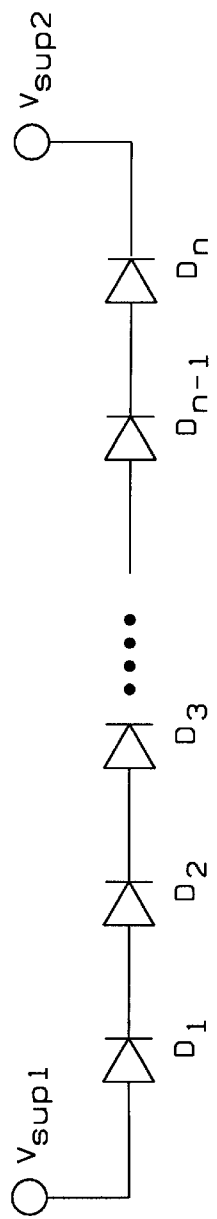

The ESD protection circuit of this invention is constructed to provide a path having a low leakage current during normal operation and a path having a consistent turn-on threshold voltage level such that as the number of stages or diodes of the ESD protection circuit increases, the turn-on threshold voltage level increases linearly. The ESD protection circuit consists of a string of serially connected polycrystalline silicon diodes $D_1, D_2, D_2, \ldots, D_{n-1}, D_n$ coupled between the interconnection networks of a two separate power supply voltage sources $V_{sup1}$ and $V_{sup2}$ as shown in FIG. 4a.

Figure 4B:
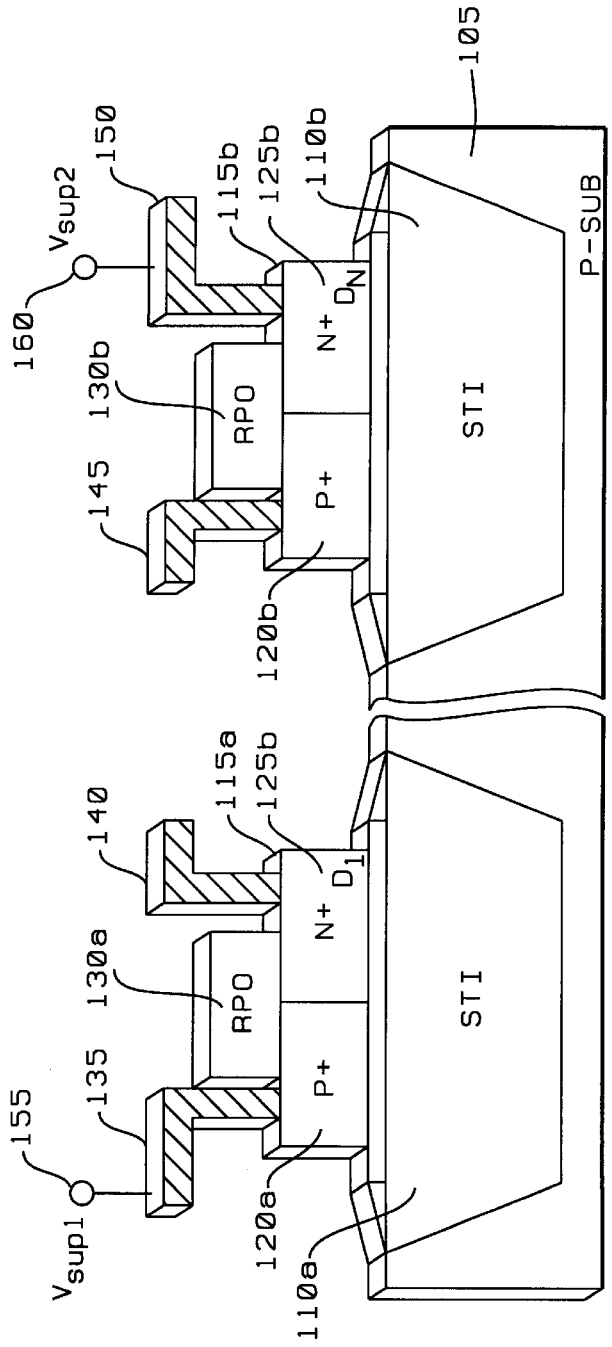
FIG. 4b is a cross sectional view of the structure of an ESD protection circuit of this invention.
Figure 5A:
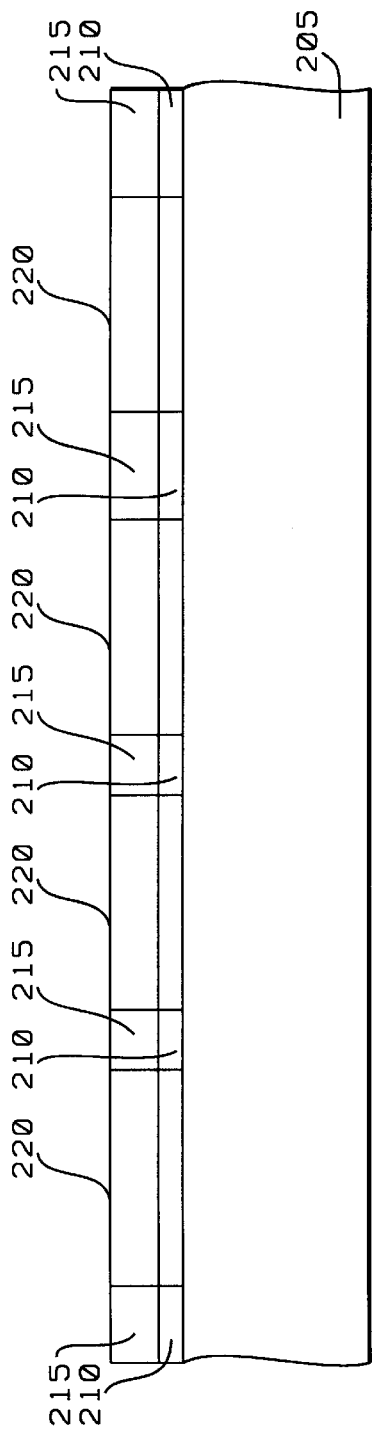
FIGS. 5a–5o are cross sectional views of a semiconductor substrate illustrating the method of the formation of the polycrystalline silicon diodes as they form the ESD protection circuit of this invention.
Figure 5B:
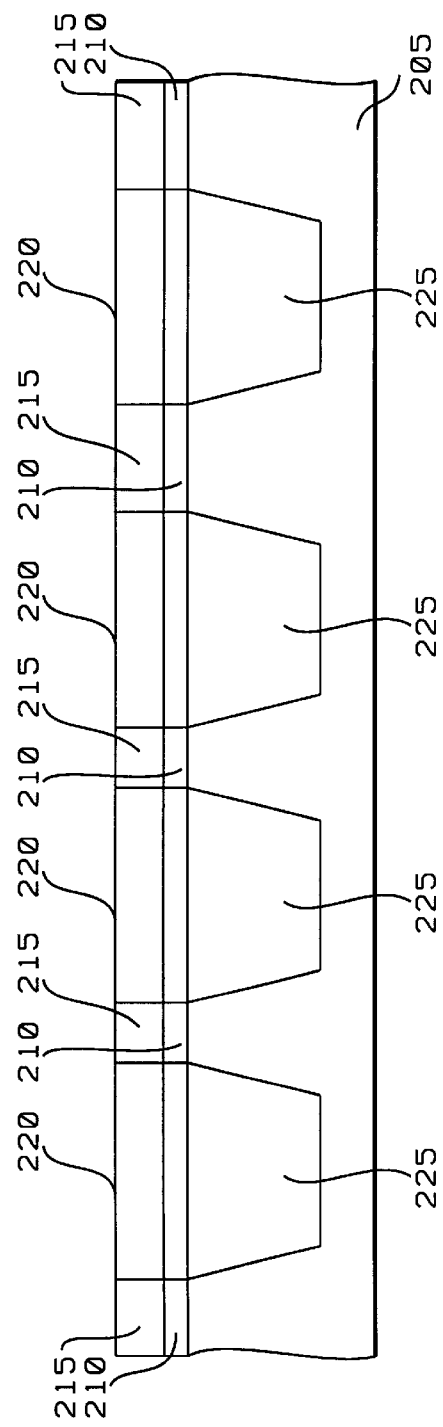
Figure 5C:
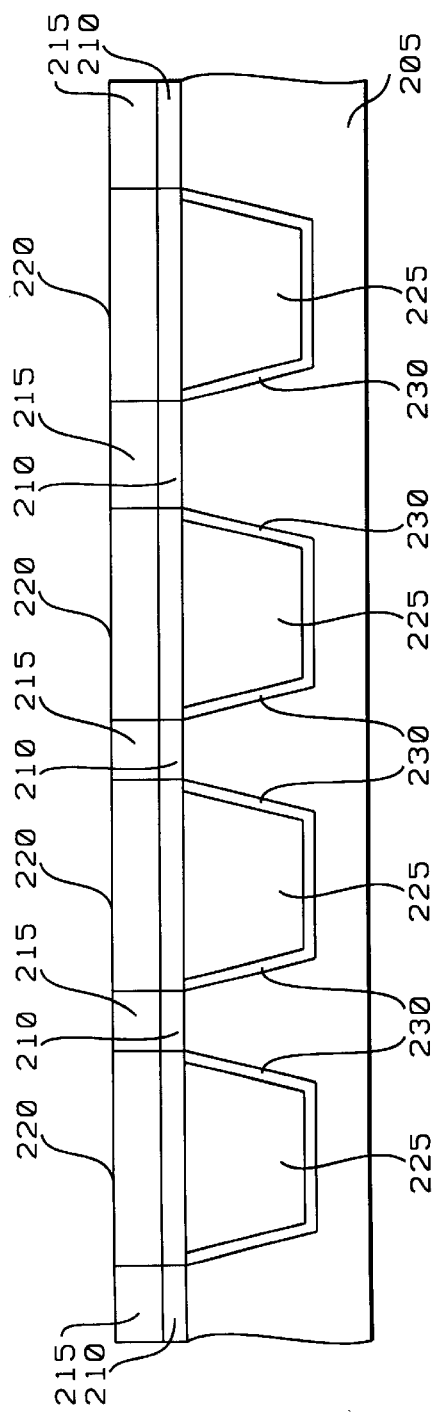
Figure 5D:
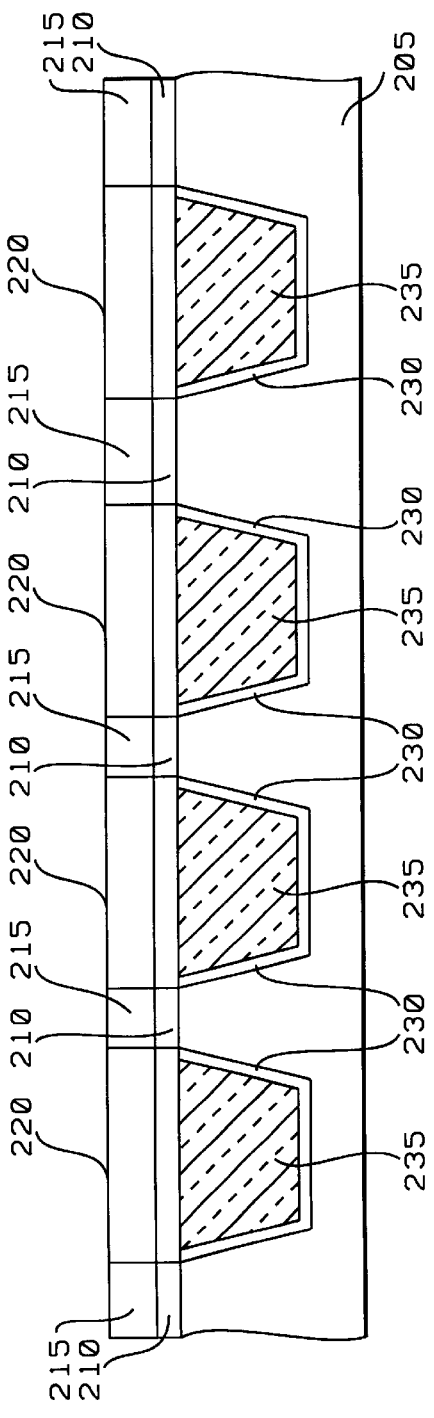
Figure 5O:
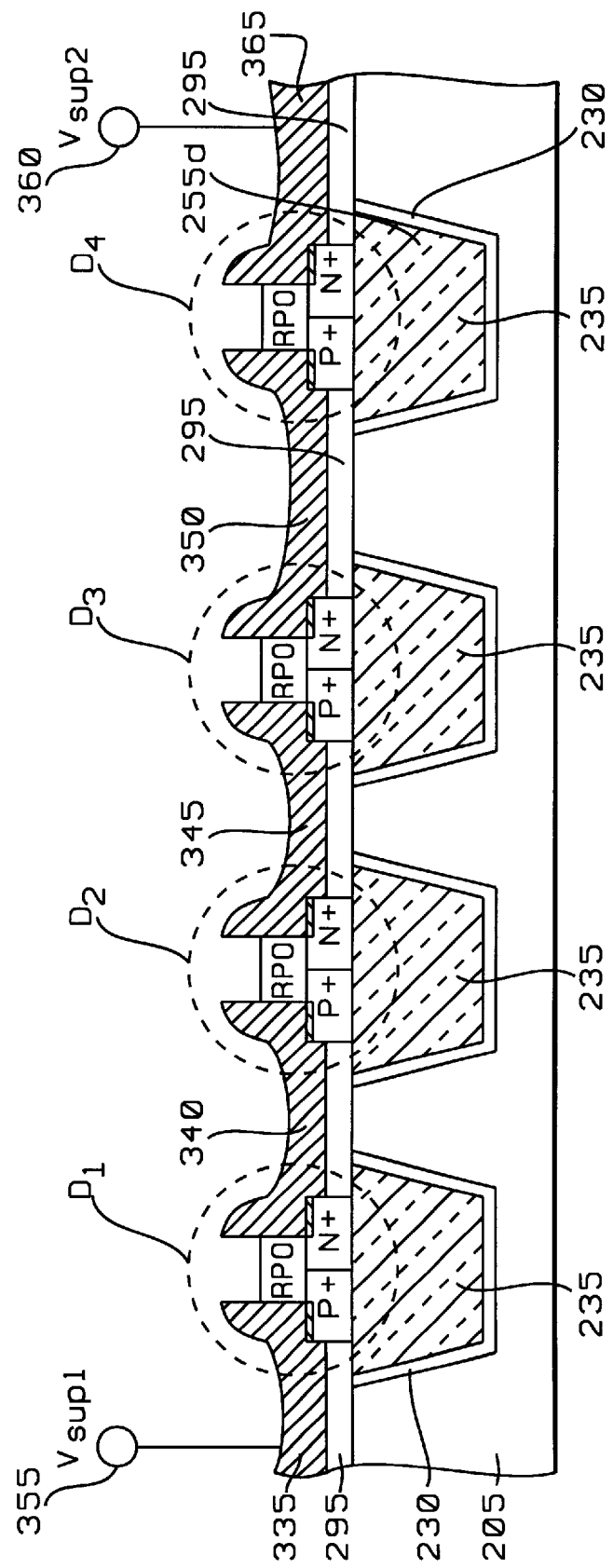
Figure 6A:
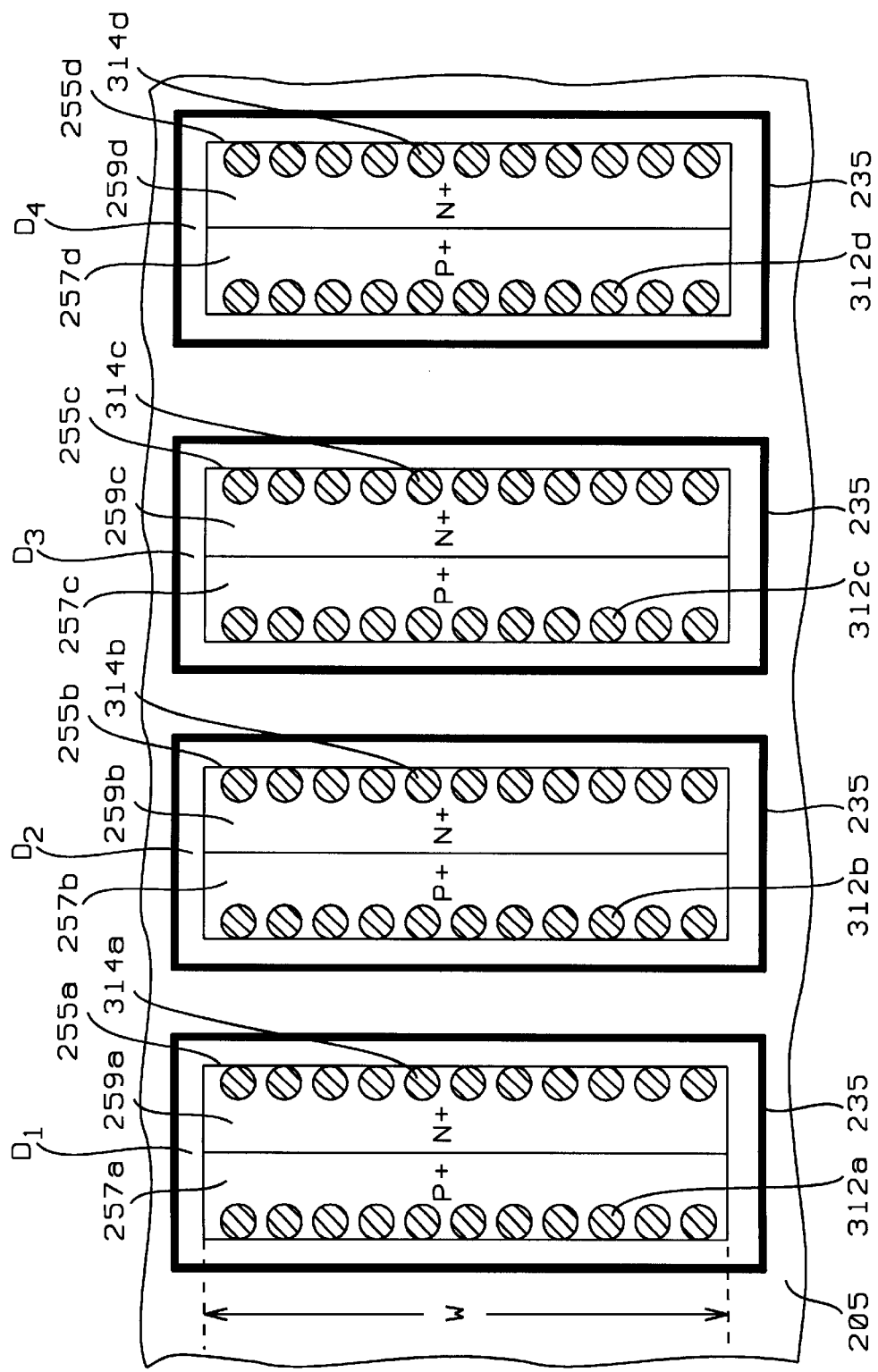
FIGS. 6a–6b are top views of a semiconductor substrate illustrating the method of the formation of the polycrystalline silicon diodes as they form the ESD protection circuit of this invention.
Figure 6B:
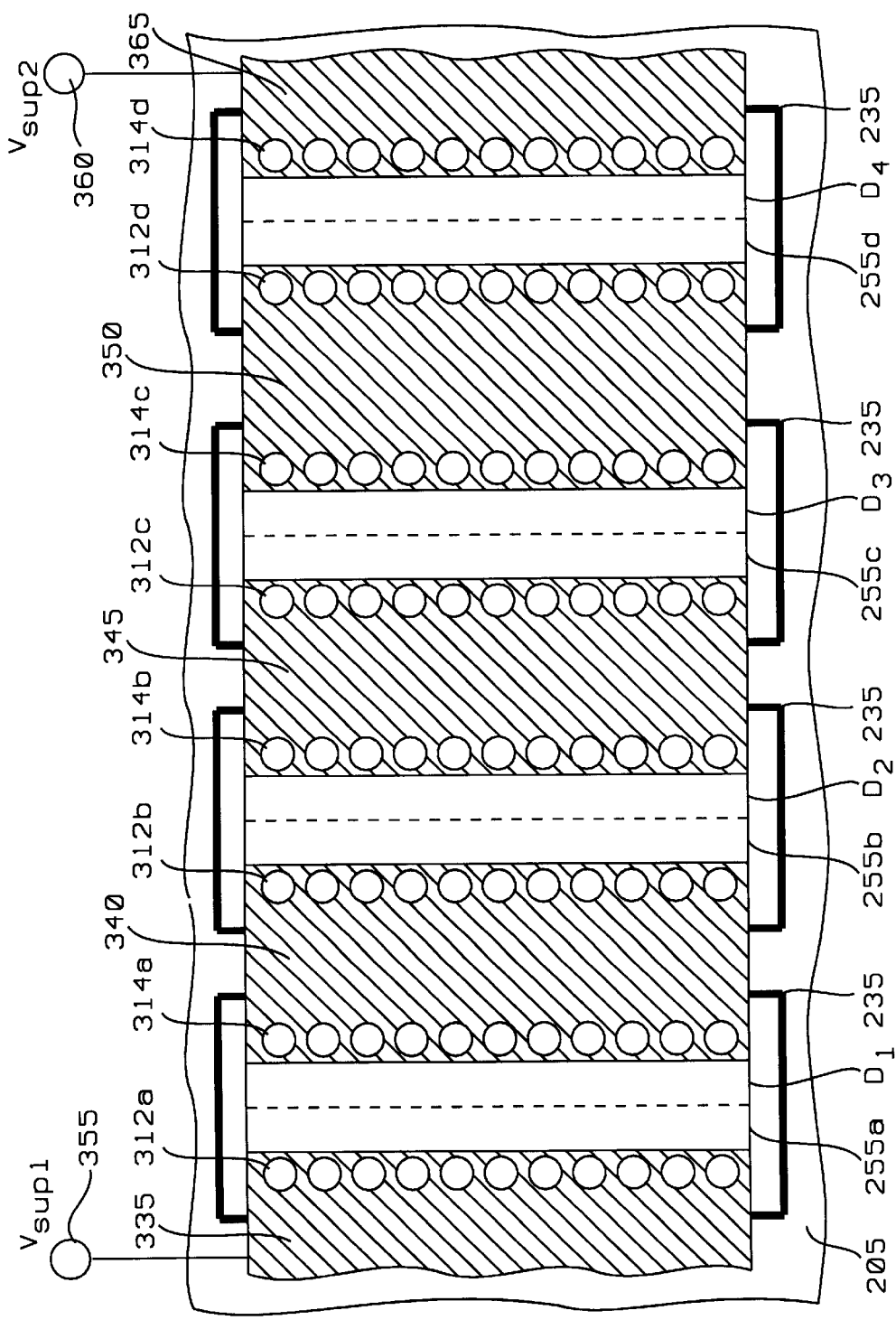

FIG. 4b illustrates the structure of the serially connected polycrystalline silicon diodes of this invention. Regions of shallow trench isolation 110a 110b are formed in the P-type substrate 105. Even though multiple regions of shallow trench isolation 110a 110b are shown, the serially connected polycrystalline silicon diodes maybe formed on a single region of shallow trench isolation 110a 110b.

Segments of polycrystalline silicon 115a and 115b are formed on the surface of each region of STI 100a and 110b. The segments of polycrystalline silicon 115a and 115b have regions 120a and 120b heavily doped with a P-type material to form an anode of the polycrystalline silicon diodes $D_1, D_2, D_3, \ldots, D_{n-1}, D_n$. The regions 125a and 125b of the segments of the polycrystalline silicon 115a and 115b are likewise heavily doped with an N-type material to form the cathodes of the polycrystalline silicon diodes $D_1, D_2, D_3, \ldots, D_{n-1}, D_n$. Each of the regions 120a and 120b, and the regions 125a and 125b have metallic alloy salicides formed on their surfaces to create contacts that form connections to the metal layers 135, 140, 145, and 150. The metal connection 135 is connected to the distribution network 155 of the power supply voltage source $V_{sup1}$. The metal connections 140 and 145 provide the connections of the cathodes to the anodes to serially connect the polycrystalline silicon diodes $D_1, D_2, D_3, \ldots, D_{n-1}, D_n$. The cathode of the last diode is coupled by the metal connection 150 to the distribution network 160 of the power supply voltage source $V_{sup2}$.

A resistor protective oxide (RPO) is formed on the surface of each segment of the polycrystalline silicon 115a and 115b to protect each segment of the polycrystalline silicon 115a and 115b, while allowing the metal to alloy with the polycrystalline silicon 115a and 115b during creation of the contacts and the metal layers 135, 140, 145, and 150.

Refer now to FIGS. 5a–5o and FIGS. 6a–6b for a discussion of the method for the fabrication of the ESD protection circuit of this invention. The method begins with the depositing of a silicon nitride ($Si_xN_y$) layer 210 and a thick oxide layer 215 on a lightly doped P-type substrate 205 to form a masking. Openings 220 are formed in the silicon nitride ($Si_xN_y$) layer 210 and a field oxide layer 215 in locations that are to form the regions of shallow trench isolation 110a and 110b of FIG. 4b. The P-type silicon substrate 205 is then etched in the openings 220 to form the shallow trenches 225 in the surface of the P-type substrate 205. Each of the trenches 225 are then lined with a with an insulation layer 230 and then further filled with an insulation material 235 such as silicon dioxide to form the shallow trench isolation.

The silicon nitride ($Si_xN_y$) layer 210 and the thick oxide layer 215 are removed generally by a chemical-mechanical planarization (CMP) that is well known in the art. A layer of polycrystalline silicon 240 is deposited on the surface of the P-type substrate 205 with a masking layer 245 being formed on the layer of polycrystalline silicon 240. Blocking areas 250 are formed in the masking layer 245 to define the locations of the segments of the polycrystalline silicon 115a and 115b of FIG. 4b.

The layer of polycrystalline silicon 240 is then etched to form the segments of the polycrystalline silicon 255a, 255b, 255c, and 255d. A masking layer 260 is then formed on the surface of the P-type substrate 205 and the segments of polycrystalline silicon 255a, 255b, 255c, and 255d. Openings 265 are formed in the masking layer 260. A P-type acceptor impurity 275 such as boron, gallium, or indium is diffused through the openings 265 into the segments of polycrystalline silicon 255a, 255b, 255c, and 255d to form the P-type anodes 257a, 257b, 257c, and 257d of the polycrystalline silicon diodes. The masking layer 260 is then removed and the masking layer 280 is then formed on the surface of the P-type substrate 205 and the segments of polycrystalline silicon 255a, 255b, 255c, and 255d. Openings 285 are formed in the masking layer 260. A N-type donor impurity 290 such as antimony, phosphorus, or arsenic is diffused through the openings 285 into the segments of polycrystalline silicon 255a, 255b, 255c, and 255d to form the N-type cathodes 259a, 259b, 259c, and 259d of the polycrystalline silicon diodes.

The masking layer 280 is removed and the insulative material 295 such as silicon dioxide is deposited upon the surface of the P-type substrate 205 and the segments of polycrystalline silicon 255a, 255b, 255c, and 255d that now form the polycrystalline silicon diodes. Blocking areas 305 are formed in the masking layer 300 to protect the desired regions of the insulative material 295. The masking layer 300 is removed and the insulative layer 300 is etched to form the resistor protective oxide (RPO) 295a, 295b, 295c, and 295d and the field insulation areas 290.

A metal such as titanium is deposited and alloyed to the segments of polycrystalline silicon 255a, 255b, 255c, and 255d in the exposed areas to form the contacts 312a, 312b, 312c, and 312d on the P-type regions 257a, 257b, 257c, and 257d and the contacts 314a, 314b, 314c, and 314d on the N-type regions 259a, 259b, 259c, and 259d. During the deposition of the metal 310, the resistor protective oxide 295a, 295b, 295c, and 295d protects the junction of the adjoined P-type regions 257a, 257b, 257c, and 257d and N-type regions 259a, 259b, 259c, and 259d.

The masking layer 325 is deposited on the metal 310 and the opening 320 are formed to demarcate the connections of the ESD protection circuit of this invention. The exposed metal 325 is etched to remove the excess so as to form the metal traces 335, 340, 345, 350, 365 to complete the interconnection of the ESD protection circuit. The anode of the diode $D_1$ is connected through the metal trace to the distribution network 355 to the power supply voltage source $V_{sup1}$. The cathode of the diode $D_1$ is connected to the anode of the diode $D_2$ by the metal trace 340. The cathode of the diode $D_2$ is connected to the anode of the diode $D_3$ by the metal trace 345. The cathode of the diode $D_3$ is connected to the anode of the diode $D_4$ by the metal trace 350. The cathode of the diode $D_4$ is connected to the distribution network 360 of the power supply voltage source $V_{sup2}$ by the metal trace 365. This structure as described forms the serially connected string of diodes $D_1$, $D_2$, $D_3$, $D_4$ between the power supply voltage source $V_{sup1}$ and the power supply voltage source $V_{sup2}$.

The width W (FIG. 6a) of the diodes and the thickness h (FIG. 5j) of the segments of polycrystalline silicon 255a, 255b, 255c, and 255d and the doping levels of the P-type regions 257a, 257b, 257c, and 257d and N-type regions 259a, 259b, 259c, and 259d determine the resistivity of the diode and thus the current capacity of the diodes $D_1$, $D_2$, $D_3$, $D_4$. The preferred doping concentration levels for the P-type regions 257a, 257b, 257c, and 257d are from approximately $10^{15}$ atoms/cm$^{-3}$ to approximately $10^{21}$ atoms/cm$^{-3}$. The preferred doping concentration levels for the N-type regions 259a, 259b, 259c, and 259d are from approximately $10^{15}$ atoms/cm$^{-3}$ to approximately 1021 atoms/cm$^{-3}$. The preferred thickness h of the segments of polycrystalline silicon 255a, 255b, 255c, and 255d is from approximately 1000 Å to approximately 3000 Å. The width W of the segments of polycrystalline silicon 255a, 255b, 255c, and 255d are preferably from approximately 0.5 μm to approximately 100 μm.

Figure 7:
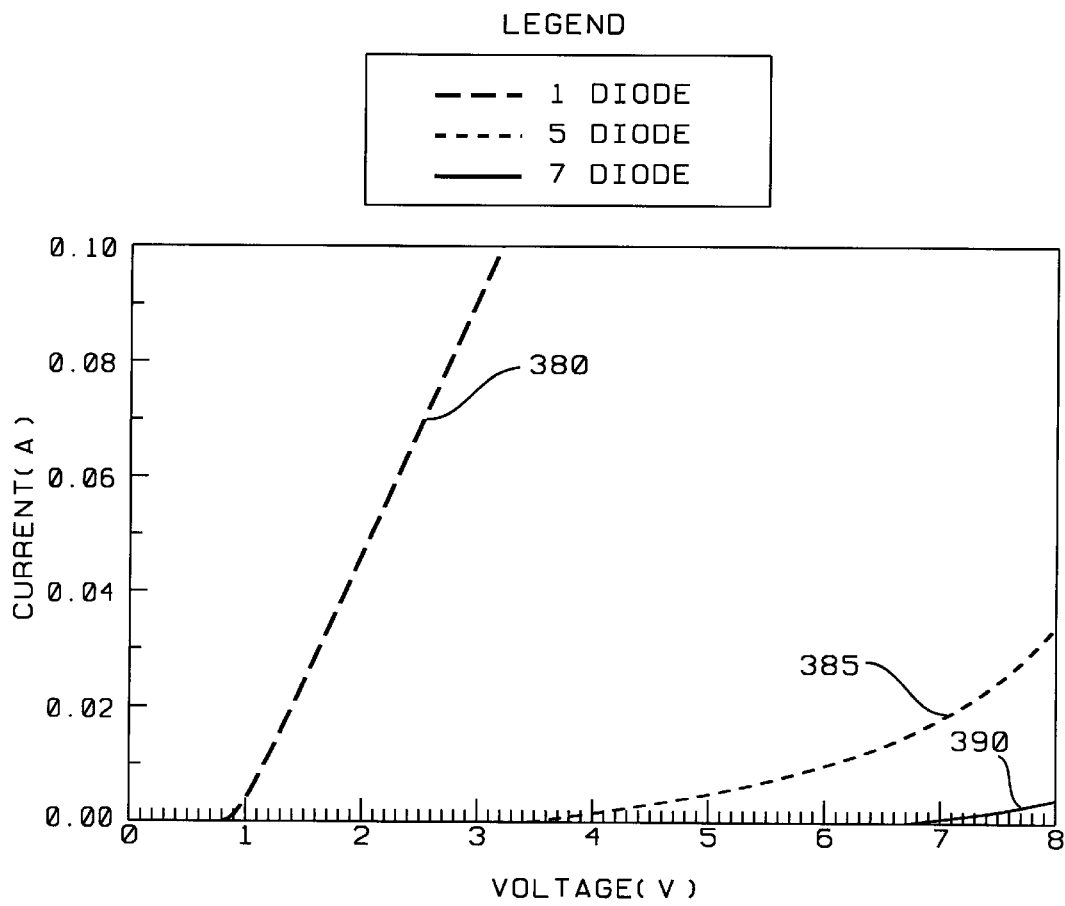
FIG. 7 is plot of the ESD protection circuit of this invention illustrating the current through a number of stages of the ESD protection circuit versus the voltage across the ESD protection circuit of this invention.

Refer now to FIGS. 3 and 7 to compare the current through the ESD protection circuit of the prior art as illustrated in FIG. 1 and the ESD protection circuit of this invention as illustrated in FIG. 4b. The comparison of the voltage level across the ESD protection circuits of the prior art and of this invention having one, five and seven stages is shown in Table 1.

TABLE 1

| Number of Stages/Circuit | Prior Art (FIG. 1) Voltage @ 1 μa | This invention (FIG. 4b) Voltage @ 1 μa |
| --- | --- | --- |
| 1 Stage | 0.65 V | 0.60 |
| 5 Stages | 2.7 V | 2.9 V |
| 7 Stages | 3.2 V | 4.0 V |

Further, when the slopes of the plots for the single stage 80, five stages 85, and seven stages 90 of the prior art are compared with the slopes of the single stage 380, five stages 385, and seven stages 390 of this invention, it becomes apparent that the threshold voltage of the ESD protection circuit of the prior art is not linear as the number of stages is increased. However, the threshold voltage of the ESD protection circuit of this invention is more nearly linear with the increase in the number of stages or diodes in the string.

The number of the serially connected polycrystalline silicon diodes $D_1, D_2, D_3, \ldots, D_{n-1}, D_n$ of FIG. 4b included in the electrostatic discharge circuit of this invention is determined by the amount of noise or change beyond the difference between the voltage levels of the power supply voltage source $V_{sup1}$ and the power supply voltage source $V_{sup2}$ that can be tolerated by the internal integrated circuits and can be calculated by the formula:

$$n \geq \frac{V_{noise} + |Vx1 - Vx2|}{V_T}$$

where:

n is the number serially connected of polycrystalline silicon diodes, $V_{noise}$ is the maximum voltage level difference allowed to be present on the internal integrated circuits between the first power supply voltage source and the second power supply voltage source, Vx1 is the magnitude of the first power supply voltage source $V_{sup1}$, Vx2 is the magnitude of the second power supply voltage source $V_{sup2}$, and $V_T$ is the threshold voltage of each polycrystalline silicon diodes.

While this invention has been particularly shown and described with reference to the preferred embodiments thereof, it will be understood by those skilled in the art that various changes in form and details may be made without departing from the spirit and scope of the invention. In particular the doping types and concentrations are shown as having particular polarities. It is in keeping with the intent of this invention that the doping types and concentrations may be varied by procedures and methods known in the art. In particular, the shallow trench isolation 110a 110b of FIG. 4 maybe a field oxide region.

What is claimed is:

1. A method for forming an electrostatic discharge circuit comprising serially connected polycrystalline silicon diodes, said method comprising the steps of:

providing a substrate;

forming polycrystalline silicon members upon said substrate:

doping a first portion of each of said polycrystalline silicon members with an impurity of a first type;

doping a second portion of each of said polycrystalline silicon members with an impurity of a second type such that a junction is formed where the first portion of each of said polycrystalline silicon members adjoins said second portion of said polycrystalline members;

connecting the second portion of one polycrystalline section to the first portion of a subsequent polycrystalline silicon member;

connecting the first portion of a first polycrystalline silicon member to a first power supply voltage source;

connecting the second portion of a last polycrystalline silicon member to a second power supply voltage source; and forming a resistor protection oxide member upon each of the polycrystalline silicon members to overlay said junction.

2. The method of claim 1 further comprising the step of:

forming a plurality of shallow trench isolation regions, each polycrystalline silicon member being formed on one of said isolation regions.

3. The method of claim 1 wherein the connecting the first and second portions of the polycrystalline silicon members comprises the steps of:

alloying a metal into top surfaces of the first and second portions of each of the polycrystalline silicon members to form contact areas; and forming connecting metallization in contact with the contact areas of the first and second portions of each polycrystalline silicon member and between the second portion of each polycrystalline silicon member and the first portion of the subsequent polycrystalline silicon member, the first portion of the first polycrystalline silicon member, and the second portion of the last polycrystalline silicon member.

4. The method of claim 1 wherein the first portion of each of the polycrystalline silicon members is a cathode of each polycrystalline silicon diode and the second portion of each of the polycrystalline members is an anode of each polycrystalline silicon diode.

5. The method of claim 1 wherein the impurity of the first type is an N-type impurity having a density of from approximately $10^{15}$ atoms/cm$^{-3}$ to approximately $10^{21}$ atoms/cm$^{-3}$.

6. The method of claim 1 wherein the impurity of the second type is a P-type impurity having a density of from approximately $10^{15}$ atoms/cm$^{-3}$ to approximately $10^{21}$ atoms/cm$^{-3}$.

7. The method of claim 1 wherein each of the polycrystalline silicon members has a thickness of from approximately 1000 Å to approximately 3000 Å.

8. The method of claim 1 wherein each of the polycrystalline silicon members has a thickness of from approximately 0.5 μm to approximately 100 μm.

9. The method of claim 1 wherein a number of the serially connected polycrystalline silicon diodes is determined by the formula:

$$n \geq \frac{V_{noise} + |Vx1 - Vx2|}{V_T}$$

where:

n is the number serially connected of polycrystalline silicon diodes, $V_{noise}$ is the maximum voltage level difference allowed to be present on the internal integrated circuits between the first power supply voltage source and the second power supply voltage source, Vx1 is the magnitude of the first power supply voltage source, Vx2 is the magnitude of the second power supply voltage source, and $V_T$ is the threshold voltage of each polycrystalline silicon diodes.

* * * * *